United States Patent
Hipwell et al.

(10) Patent No.: US 8,441,106 B2
(45) Date of Patent: May 14, 2013

(54) APPARATUS AND METHOD FOR DEFINING LASER CLEAVE ALIGNMENT

(75) Inventors: Roger L. Hipwell, Eden Prairie, MN (US); Tanya J. Snyder, Edina, MN (US); Scott E. Olson, Eagan, MN (US); Edward C. Gage, Lakeville, MN (US)

(73) Assignee: Seagate Technology LLC, Cupertino, CA (US)

( * ) Notice: Subject to any disclaimer, the term of this patent is extended or adjusted under 35 U.S.C. 154(b) by 73 days.

(21) Appl. No.: 13/030,496

(22) Filed: Feb. 18, 2011

(65) Prior Publication Data

US 2011/0198731 A1  Aug. 18, 2011

Related U.S. Application Data

(60) Provisional application No. 61/305,782, filed on Feb. 18, 2010.

(51) Int. Cl.
*H01L 23/544* (2006.01)
*H01L 21/66* (2006.01)

(52) U.S. Cl.
USPC ............ 257/620; 257/618; 257/E23.171; 257/E21.573; 257/E33.001; 438/5

(58) Field of Classification Search ......... 257/618, 257/620, E23.179, E21.573, E33.001; 438/5
See application file for complete search history.

(56) References Cited

U.S. PATENT DOCUMENTS

| | | |
|---|---|---|
| 5,360,761 A | 11/1994 | Andrews |
| 2002/0172244 A1 | 11/2002 | Li et al. |
| 2005/0150597 A1 | 7/2005 | Henley et al. |
| 2008/0111142 A1* | 5/2008 | Furushima et al. ............ 257/91 |
| 2009/0321956 A1* | 12/2009 | Sasaki et al. ................. 257/777 |

* cited by examiner

*Primary Examiner* — Peniel M Gumedzoe
(74) *Attorney, Agent, or Firm* — Hollingsworth Davis, LLC

(57) ABSTRACT

An apparatus includes a crystalline substrate. A cleaving guide on the substrate is positioned over a cleave plane of the crystalline substrate and positioned in a known location with respect to a feature of an electronic device on the substrate. Cleaving of the substrate along the cleave plane changes a physical characteristic of the cleaving guide and measurement of the physical characteristic provides a parameter representative of the relative position of the cleave plane and the cleaving guide.

15 Claims, 5 Drawing Sheets

APPARATUS AND METHOD FOR DEFINING LASER CLEAVE ALIGNMENT

CROSS-REFERENCE TO A RELATED APPLICATION

This application claims the benefit of U.S. Provisional Patent Application Ser. No. 61/305,782, filed Feb. 18, 2010, and titled "Method For Laser Diode Facet Cleave Metrology", which is hereby incorporated by reference.

BACKGROUND

Semiconductive devices are commonly fabricated on a substrate of crystalline material. The devices can then be separated by cleaving the substrate along planes of the crystal structure of the substrate. When edge-emitting laser diodes are fabricated on a substrate, the position of the cleaved facet with respect to other features on the substrate typically don't need to be controlled to within extremely precise references (e.g. less than a micron). However, in certain applications where the cleaved facet edge requires precision positioning with respect to other patterned features on the laser diode, a method of characterizing the cleave position is critical to establish yield or assembly offset positions. One such application is for the precise positioning of laser diodes in integrated laser-assisted read-write disc drive heads, where sub-micron alignment capability is desired to allow for acceptable alignment with optical components.

There is a need for a method and apparatus that can be used to determine of the relative position of features of electronic devices with respect to cleaving planes of a substrate.

SUMMARY

In one aspect, the present disclosure relates to an apparatus including a crystalline substrate, and a cleaving guide on the substrate positioned over a cleave plane of the crystalline substrate and positioned in a known location with respect to a feature of an electronic device on the substrate, wherein cleaving of the substrate along the cleave plane changes a physical characteristic of the cleaving guide and measurement of the physical characteristic provides a parameter representative of the relative position of the cleave plane and the cleaving guide.

In another aspect a method, involves providing a first cleaving guide positioned over a cleave plane of a crystalline substrate. The first cleaving guide is further positioned in a known location with respect to features of an electronic device on the substrate. The crystalline substrate is cleaved, and a physical characteristic of the first cleaving guide is measured. The measurement of the physical characteristic provides a parameter representative of the relative position of the cleave plane and the cleaving guide.

DETAILED DESCRIPTION

In one aspect, the present disclosure is related to an apparatus and method enabling in-situ metrology for a facet cleave location with respect to features of electronic devices on a crystalline substrate using a cleaving guide. The cleaving guide can be, for example, a resistive electrical cleaving guide (ECG) or an optical cleaving guide (OCG). In one embodiment, the features can be patterned features on a laser diode (such as positioning bond pads). Measurement of a physical characteristic (e.g. resistance or reflectance) of the cleaving guide can be used to provide a parameter representative of the relative position of the cleave plane and the cleaving guide. The apparatus and method can provide a quick and precise metrology mechanism for laser facet cleave position that doesn't require expensive or long inspections.

The ECG can be implemented as an analog device, in which a resistance measurement provides an indication of cleaving position, or as a digital device in which an array of offset electrical cleaving guide can be used to provide a series of binary indications, providing a simple positioning window. The OCG can be implemented using one or more reflective elements positioned over the desired cleaving plane. While the ECG and OCG may be shown and described herein as being implemented in the context of semiconductor laser diodes, it will be appreciated that these concepts may be applicable to any type of electrical and/or optical device where cleaving is used to precisely form dimensions of the device.

Figure 1:
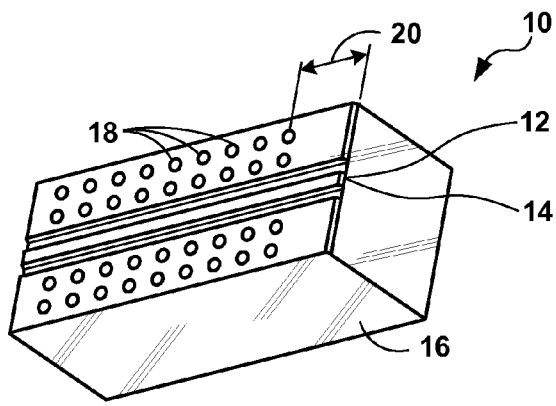
FIG. 1 is an isometric view of a semiconductor laser diode assembly.

FIG. 1 is an isometric view of an exemplary semiconductor laser and waveguide assembly 10. The assembly includes a laser 12, which can be for example an edge emitting laser or another type of laser, having an output facet 14 and fabricated on a substrate 16 of a crystalline material. The output facet can be positioned on a cleavage plane of the crystalline substrate. The assembly can further include a plurality of connection pads, such as solder bumps 18. In certain applications of the lasers, such as when the lasers are to be subsequently mounted in a recording head, the distance 20 the connection pads and the output facet should be tightly controlled. There is a need for a way to determine if this distance is within an acceptable range and therefore whether the laser passes or fails.

An array of laser assemblies such as those of FIG. 1 can be fabricated on a wafer of crystalline substrate material. The wafer can be cut into a plurality of bars that include, for example, a linear array of laser diodes. Then the bars can be cleaved to establish the position of the laser output facet. A cleaving guide can be used to provide an indication of the location of the cleavage plane with respect to a feature of the laser assemblies.

In one aspect, an apparatus includes one or more electronic devices (e.g. laser diode assemblies) on a crystalline substrate including a plurality of cleavage planes, and a cleaving guide on the substrate is positioned over at least one of the cleavage planes and in a known location with respect to a feature of the electronic device. Cleaving of the substrate along the cleavage plane changes a physical characteristic (e.g. resistance or reflectance) of the cleaving guide. By using the change in the physical characteristic of the cleaving guide to provide an indication (e.g., signal) of the relative location of the cleave with respect to the cleaving guide, an in-situ metrology is provided to determine the facet cleave location with respect to the feature of the electronic device. In one embodiment, the feature of the electronic device can be contact pads, and the electronic device can be a laser diode assembly.

Figure 2:
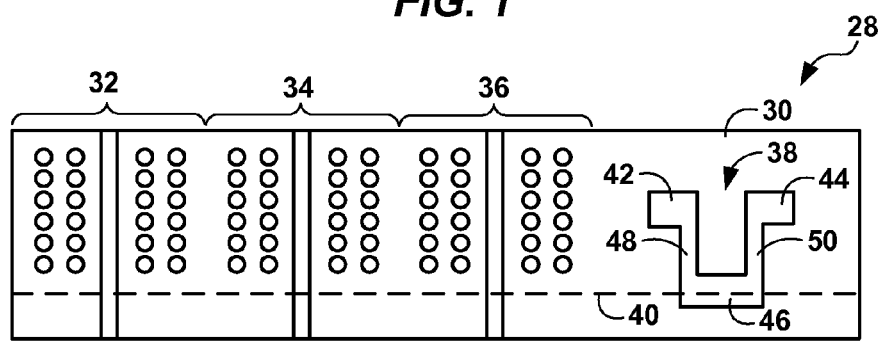
FIG. 2 is a schematic representation of a bar including a crystalline substrate, a plurality of laser diodes, and an electrical cleaving guide.

FIG. 2 is a schematic representation of a bar 28 according to an example embodiment. The bar 28 includes a crystalline substrate 30, a plurality of laser diodes assemblies 32, 34, 36, and a cleaving guide 38 positioned to straddle a cleaving plane 40. In this example, the cleaving guide 38 is an electronic cleaving guide (ECG) including first and second contact pads 42, 44 and a conductive portion in the form of a conductive element or strip 46, which is electrically connected to the first and second contact pads 42, 44 through conductors 48 and 50. The electronic cleaving guide 38 is in the form of a generally U-shaped structure.

The ECG 38 can be positioned on or in the substrate at a known location with respect to a feature of the electronic device. As shown in FIG. 2, the ECG 38 can be a thin resistor (e.g. a thin metallic layer) including first and second contacts and a resistive element or strip that electrically connects the first and second contacts. The ECG 38 is position such that it straddles at least one cleaving plane 40 of the substrate. The contacts can be big enough to be electrically probed.

The location of the resistive strip is such that the facet cleaving location will directly impact measured resistance of the strip due to mechanical removal of portions the strip during the facet cleaving. Thus the resistance of the cleaving guide as measured between the contacts will change after a portion of the conductive strip is removed. By measuring the resistance of the cleaving guide, it is possible to determine the amount of the strip that remains after cleaving, and thus the location of the cleave plane, since the resistance will be a function of the amount of conductive material left in the strip following cleaving. Once the relative location of the cleave plane with respect to the cleaving guide is known, then the distance between the cleave plane and the feature of the electronic device can be easily determined, since the distance between the cleaving guide and the feature of the electronic device was previously known. This distance may be used to determine whether the resulting device passes or fails based on acceptable distance features. This can provide the potential for submicron metrology of the bar cleaving distance from the reference pads on the electronic device without need for complex and expensive inspections, such as a scanning electron microscope.

Figure 3:
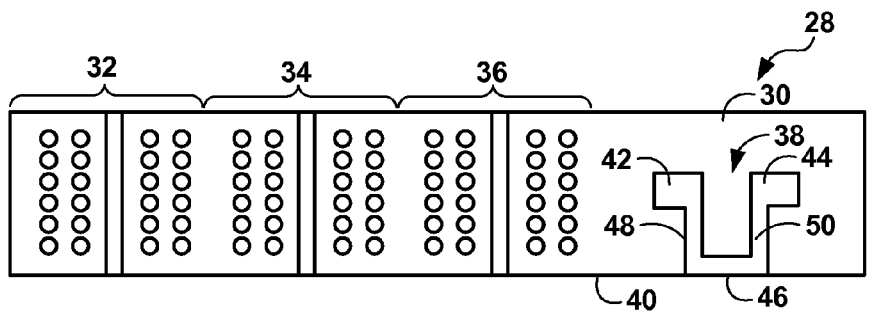
FIG. 3 is a schematic representation of the bar of FIG. 2 after cleaving along a cleaving plane.

FIG. 3 is a schematic representation of the bar of FIG. 2 after cleaving along the cleaving plane 40. As shown in FIG. 3, the bottom portion of the resistive strip has been narrowed due to cleaving. This results in a higher resistance of the cleaving guide, which can be measured by connecting probes to the connection pads. The value of the resistance (or a signal that varies in proportion to the resistance) is then representative of the position of the cleaving plane.

In another example, multiple ECGs may be placed in non-critical locations along the bar (or in "dummy" laser positions) to provide feedback throughout the cleaved bar. The feedback can be a continuously varying signal used during the laser manufacturing process to optimize a cleave-to-feature position. The cleave signal could also be used to adjust desired facet position in the laser mounting.

Figure 4:
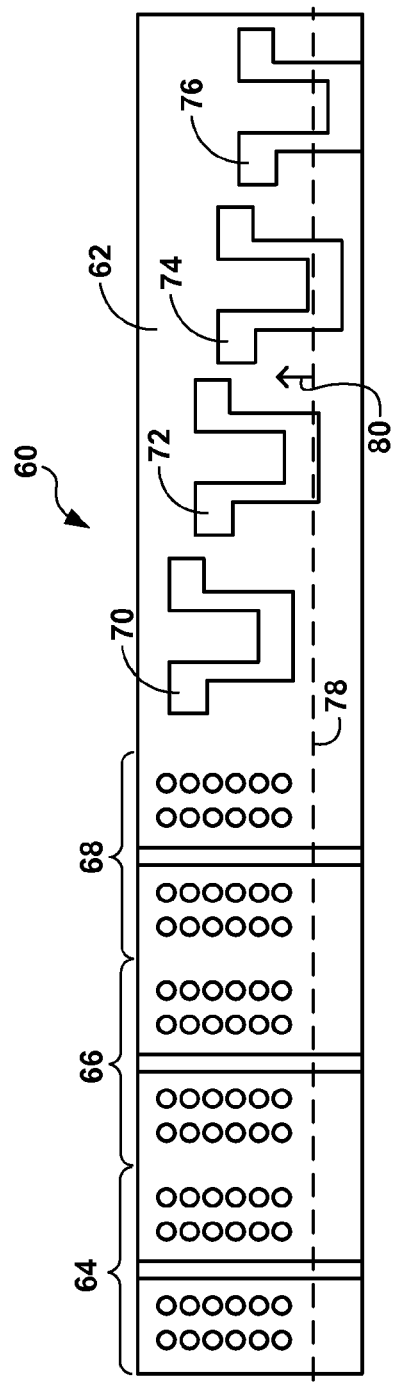
FIG. 4 is a schematic representation of a bar including a crystalline substrate, a plurality of laser diodes, and a plurality of electrical cleaving guides.

In FIG. 4, a schematic represents a bar 60 according to an example embodiment. The bar 60 includes a crystalline substrate 62, a plurality of laser diode assemblies 64, 66 and 68, and a plurality of electrical cleaving guides 70, 72, 74 and 76. Each of the electrical cleaving guides includes first and second contact pads and a resistive element electrically connected to the contact pads, similar to the electrical cleaving guide of FIG. 2. The electrical cleaving guides are generally U-shaped and are offset with respect to each other in a direction substantially perpendicular to the cleaving plane 78, indicated by arrow 80.

In one example, the multiple electrical cleaving guides can form a digital ECG. An array of ECGs that are offset with respect to each other in a direction substantially perpendicular to cleaving plane may be used to provide a "binary feedback" that indicates whether the cleave is within a specified tolerance window. For example, if the cleave is within the specified spacing, some of the ECG resistive strips would be entirely cleaved away, thus leaving an open resistor circuit, while others remain intact. With this scheme, it is not necessary to measure the resistance of the electrical cleaving guides. A simple continuity measurement can be made between the electrical cleaving guide contacts to determine if the conductive strip has been completely removed.

Figure 5:
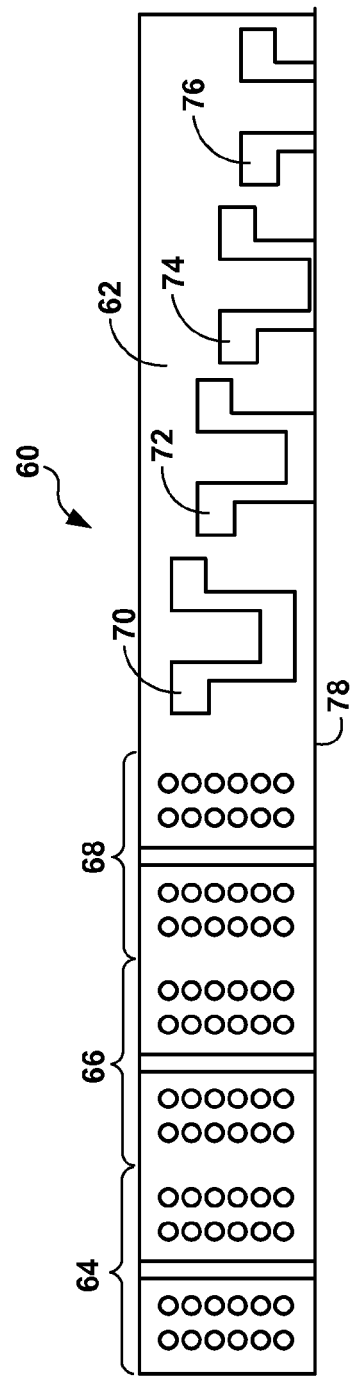
FIG. 5 is a schematic representation of the bar of FIG. 4 after cleaving along a cleaving plane.

FIG. 5 is a schematic representation of the bar of FIG. 4 after cleaving along a cleaving plane 78. In the example of FIG. 5, a portion of the resistive element of electrical cleaving guide 76 has been completely removed, creating on open circuit between the contact pads of that electrical cleaving guide. In addition, portions of the resistive elements of electrical cleaving guides 72 and 74 have been removed, thereby increasing the resistance measured between the contact pads of those electrical cleaving guides. Electrical cleaving guide 70 has not been altered. By measuring the electrical continuity between the contacts of the electrical cleaving guides, one can determine the location of the cleave. For example, since electrical continuity exists between the contact pads of guides, 70, 72 and 74, those guide could be used to represent a binary "1" and the absence of electrical continuity for guide 76 could represent a binary "0". This a binary representation of 1110 would indicate that the cleave occurred along a plane that severed guide 76, but not the other guides.

Figure 6:
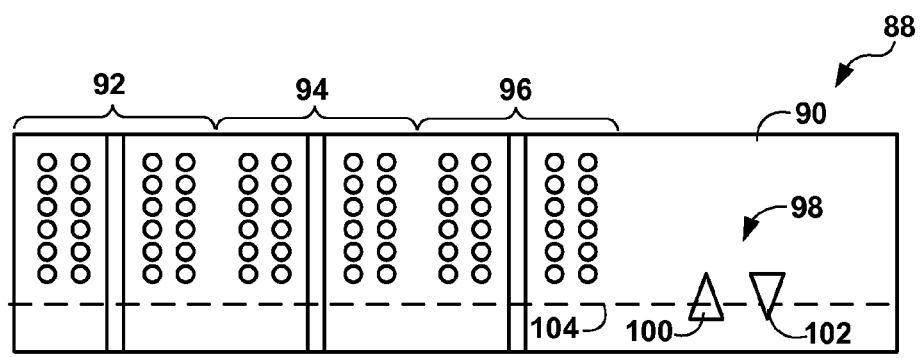
FIG. 6 is a schematic representation of a bar including a crystalline substrate, a plurality of laser diodes, and an optical cleaving guide.

In another example the cleaving guide can be an optical cleaving guide (OCG) positioned on the substrate at a known position with respect to a feature of the electrical device. FIG. 6 is a schematic representation of a bar 88 including a crystalline substrate 90, a plurality of laser diode assemblies 92, 94, 96, and an optical cleaving guide 98 comprising two triangular sections 100 and 102. The triangular sections straddle a cleaving plane 104 and are made of a material that has a different reflectivity from the reflectivity of the substrate material. In this example, the reflectance of the optical cleaving guide is used to determine the location of a cleave. The optical cleave guides could be made from a metallic or dielectric material to provide contrast with the laser material.

Figure 7:
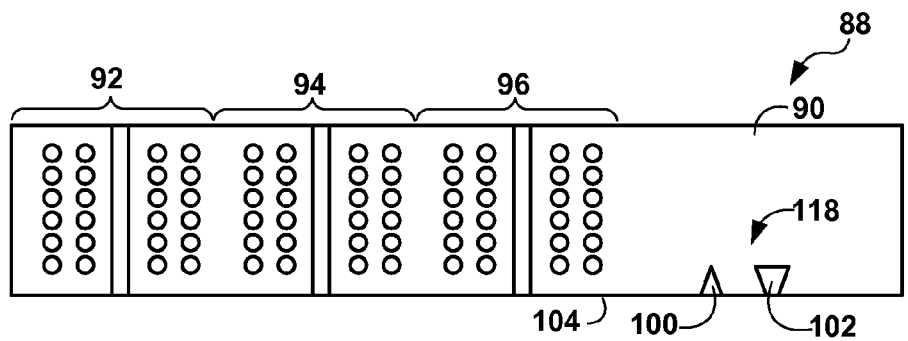
FIG. 7 is a schematic representation of the bar of FIG. 6 after cleaving along a cleaving plane.
Figure 8:
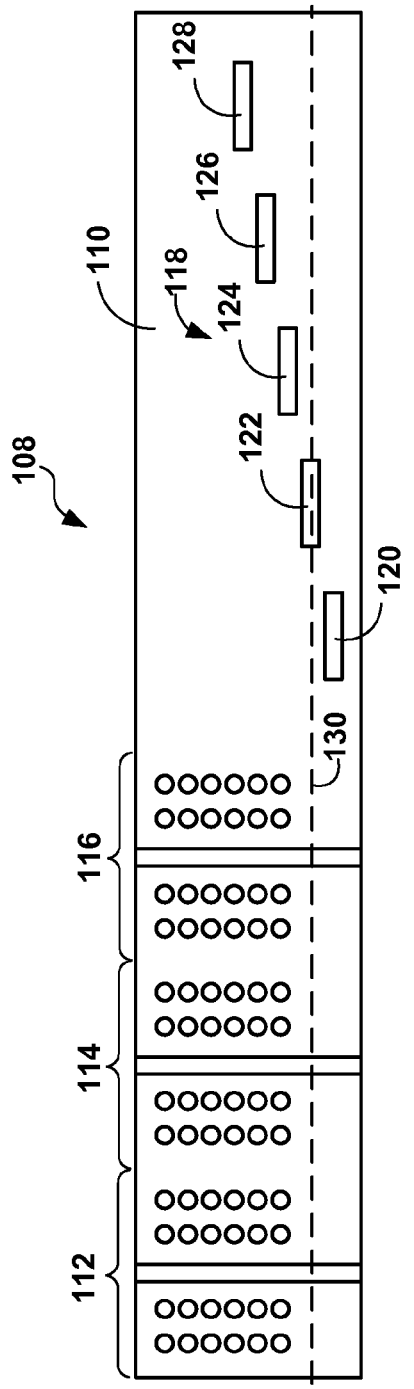
FIG. 8 is a schematic representation of a bar including a crystalline substrate, a plurality of laser diodes, and a plurality of optical cleaving guides.

FIG. 7 is a schematic representation of the bar of FIG. 8 after cleaving along the cleaving plane 104. In FIG. 7 if w1 is the width of triangle 100 at the cleave point and w2 is the width of triangle 102 at the cleave point than the cleave error is: Cleave Error=$(w1\ w2)/(4^{tan\ (\theta/2)})$, where $\theta$ is the angle at the apex of the triangles. In one example, w1 and w2 could be measured by an optical microscope or a scanning electron microscope for higher resolution. Alternatively, the reflectance of the cleaving guides could be measured after the cleave and the reflectance could indicate the amount of cleave guide material left on the substrate, and thus the location of the clave with respect to the cleaving guide.

A digital optical cleave guide may be produced with a staircase shaped cleave guide. The devices could be spread across the bar so that the angle of the cleave could be analyzed. FIG. 8 is a schematic representation of a bar 108 according to an example embodiment. The bar 108 includes a crystalline substrate 110, a plurality of laser diode assemblies 112, 114, 116, and an optical cleaving guide 118 comprising a plurality of sections 120, 122, 124, 126 and 128 that are offset with respect to each other in a direction perpendicular to the cleavage plane 130. The optical cleaving guide sections straddle a cleavage plane and are made of a material that has a different reflectivity from the reflectivity of the substrate material. The optical cleave guide sections could be made from a metallic or dielectric material to provide contrast with the laser material. In this example, the reflectance of the optical cleaving guide remaining after cleaving is used to determine the location of a cleave.

Figure 9:
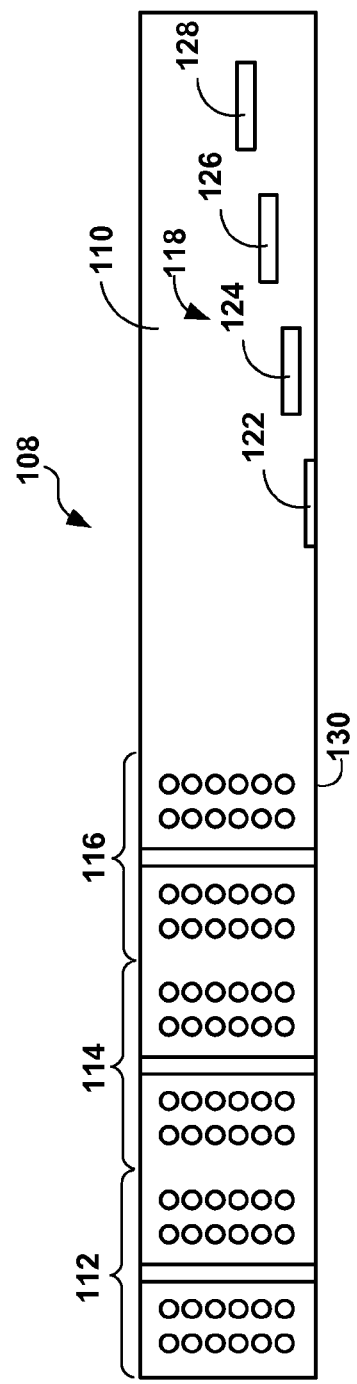
FIG. 9 is a schematic representation of the bar of FIG. 8 after cleaving along a cleaving plane.

FIG. 9 is a schematic representation of the bar of FIG. 8 after cleaving along the cleaving plane 130. Again, the cleaving guide can be used to provide a binary representation of the location of the cleave. Since sections 122, 124, 126 and 128 remain on the substrate after the cleave, the measurement of light reflected form those sections could represent a binary "1", while the absence of reflected light from section 120 could represent a binary "0". While the sections of the cleaving guide in FIGS. 8 and 9 are shown to have a rectangular shape, other shapes can be used.

As described above, in one example, electrical cleave guides using resistance values can be used to sense the laser diode cleave position. This approach can be very sensitive and provide feedback to the laser cleaving process. In another example, optical cleave guides are used. The optical cleave guides could be made from a metallic or dielectric material to provide contrast with the laser material. The cleaving guides could also be spread across the bar so that the angle of the cleave could be analyzed.

In another aspect, a method may involve providing a first cleaving guide positioned over a cleave plane of a crystalline substrate, wherein the first cleaving guide is further positioned in a known location with respect to features of an electronic device on the substrate; cleaving the crystalline substrate; and measuring a physical characteristic of the first cleaving guide, wherein the measurement of the physical characteristic provides a parameter representative of the relative position of the cleave plane and the cleaving guide. The cleaving guide can be a resistive or reflective guide as described above. Since the relative location of the cleaving guide with respect to a feature of the electronic device is known, once one knows the location of the cleave plane with respect to the cleaving guide, the distance from the cleave plane to the feature on the electronic device can be easily determined.

In another embodiment, the cleaving guide can include multiple resistive or reflective elements that are offset with respect to each other. If resistive guides are used, the electrical continuity of the guides after the cleaving operation can represent bits in a binary parameter that indicates the location of the cleave plane. For example, guides that remain on the substrate following cleaving would still exhibit electrical continuity between their contact pads. This presence of electrical continuity could represent a binary "1". For those guides that are severed by the cleave, the lack of continuity could represent a binary "0". With this method, the cleaving guides are used to produce a binary signal that is representative of the location of the cleave plane.

Figure 10:
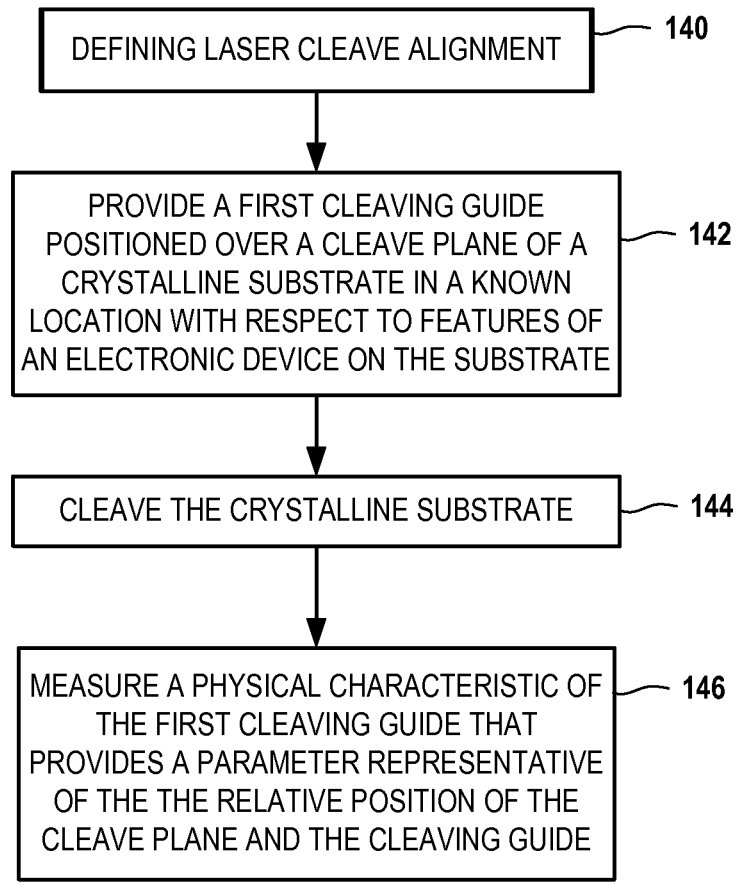
FIG. 10 is a flowchart showing a procedure according to an example embodiment.

In reference now to FIG. 10, a flowchart illustrates a procedure 140 for defining laser cleave alignment according to an example embodiment. The procedure 140 involves providing 142 a first cleaving guide positioned over a cleave plane of a crystalline substrate in a known location with respect to features of an electronic device on the substrate. The crystalline substrate is cleaved 144, and a physical characteristic of the first cleaving guide is measured 146. The measurement of the physical characteristic provides a parameter representative of the relative position of the cleave plane and the cleaving guide. It should be noted that the cleaving operation 144 may be optional, as the characteristic may be measured 146 before the cleaving is ever performed, e.g., where the characteristic provides feedback to guide or direct equipment used in the cleaving operation 144, without requiring the operation 144 actually be completed.

While several example embodiments have been presented, it will be apparent to those skilled in the art that various changes can be made to the described examples without departing from the scope as set forth in the following claims. The implementations described above and other implementations are within the scope of the following claims.

What is claimed is:

1. An apparatus, comprising:
   a crystalline substrate; and
   a cleaving guide on the substrate positioned over a cleave plane of the substrate and positioned in a known location with respect to a feature of an electronic device on the substrate, the cleaving guide comprising a first resistive element including first and second contacts and a conductive element electrically connecting the first and second contacts, wherein cleaving of the substrate along the cleave plane changes a resistance of the cleaving guide and measurement of the resistance via the first and second contacts provides a parameter representative of a relative position of the cleave plane and the cleaving guide after the cleaving of the substrate.

2. The apparatus of claim 1, wherein the first resistive element is generally U-shaped, and wherein the first and second contacts are disposed on the same side of the cleave plane.

3. The apparatus of claim 1, wherein the resistance of the first resistive element following cleaving of the substrate is representative of the relative position of the cleave plane and the cleaving guide.

4. The apparatus of claim 1, wherein the first resistive element comprises a metal film.

5. The apparatus of claim 1, wherein the electronic device comprises a laser, and wherein the parameter comprises a distance between an output facet of the laser and a contact pad of the laser used to determine a pass/fail condition of the laser.

6. The apparatus of claim 1, wherein the parameter is used as feedback to optimize a location of a cleaving operation on the substrate.

7. The apparatus of claim 1, wherein the parameter comprises a binary parameter representative of the relative position of the cleave plane and the cleaving guide.

8. An apparatus, comprising:
   a crystalline substrate; and
   a plurality of cleaving guides on the substrate, at least one of the cleaving guides being positioned over a cleave plane of the crystalline substrate and positioned in a known location with respect to a feature of an electronic device on the substrate, wherein cleaving of the substrate along the cleave plane changes a physical characteristic of at least one of the cleaving guides and measurement of the physical characteristic of each of the cleaving guides provides a binary parameter representative of a relative position of the cleave plane and the cleaving guides.

9. The apparatus of claim 8, wherein each of the cleaving guides comprises:
first and second contacts; and
a conductive element electrically connecting the first and second contacts.

10. The apparatus of claim 8, wherein the physical characteristic comprises an electrical continuity and the electrical continuity of each of the cleaving guides following cleaving of the substrate is representative of a bit in the binary parameter.

11. The apparatus of claim 8, wherein the physical characteristic comprises a reflectance and each of the cleaving guides comprise a structure having a reflectance that differs from a reflectance of the crystalline substrate.

12. A method, comprising:
providing a first cleaving guide positioned over a cleave plane of a substrate, wherein the first cleaving guide is further positioned in a known location with respect to features of an electronic device on the substrate;
measuring a physical characteristic of the first cleaving guide, wherein the measurement of the physical characteristic provides a parameter representative of the relative position of the cleave plane and the cleaving guide;
using the parameter as feedback to optimize a location of a cleaving operation on the substrate; and
performing the cleaving operation on the substrate in response thereto.

13. The method of claim 12, wherein the physical characteristic comprises at least one of a resistance and a reflectance.

14. The method of claim 12, further comprising:
providing one or more additional cleaving guides on the substrate and offset in a direction substantially perpendicular to the cleave plane with respect to the first cleaving guide; and
measuring a physical characteristic of the first cleaving guide and the additional cleaving guides, wherein measurement of the physical characteristics of the first cleaving guide and the additional cleaving guides provides a binary parameter indicative of the relative position of the cleave plane and the cleaving guides.

15. The method of claim 12, further comprising:
cleaving the substrate; and
determining, based on the parameter, a pass/fail criteria of the electronic device after the cleaving of the substrate.

* * * * *